US012787684B2

(12) United States Patent
Lee et al.

(10) Patent No.: US 12,787,684 B2

(45) Date of Patent: Nov. 3, 2026

(54) CHIP EJECTING APPARATUS AND METHOD

(71) Applicant: SAMSUNG ELECTRONICS CO., LTD., Suwon-si (KR)

(72) Inventors: Jae Ryoung Lee, Suwon-si (KR); Jae Kun Shin, Suwon-si (KR); Dong Jun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 18/912,245

(22) Filed: Oct. 10, 2024

(65) Prior Publication Data

US 2025/0266273 A1 Aug. 21, 2025

(30) Foreign Application Priority Data

Feb. 21, 2024 (KR) ........................ 10-2024-0024974

(51) Int. Cl.

*H10P 72/00* (2026.01)
*H10P 72/70* (2026.01)

(52) U.S. Cl.

CPC ...... *H10P 72/0442* (2026.01); *H10P 72/7402* (2026.01)

(58) Field of Classification Search

CPC .. H01L 21/6838; H10P 72/78; H10P 72/7414; H10P 72/0442; H10P 72/7402; H10P 72/744; H10P 72/7612

See application file for complete search history.

(56) References Cited

U.S. PATENT DOCUMENTS 6,981,312 B2 * 1/2006 Rezaei ................ H10P 72/0442 29/739
8,250,742 B2 8/2012 Kloeckner et al.
9,929,036 B2 3/2018 Kwong et al.
(Continued)

FOREIGN PATENT DOCUMENTS

KR 10-1997-0023916 A 5/1997
KR 10-1271291 B1 6/2013
(Continued)

OTHER PUBLICATIONS

Lee, KR20210009842, machine translation relied upon (Year: 2021).*
Ok, KR20080000452, machine translation (Year: 2008).*

*Primary Examiner* — Philip C Tucker
*Assistant Examiner* — Hana C Page
(74) *Attorney, Agent, or Firm* — Sughrue Mion, PLLC

(57) ABSTRACT

A chip ejecting apparatus may include: a wafer stage configured to receive a dicing tape and a plurality of chips attached to the dicing tape; an ejector under the wafer stage, the ejector configured to eject gas toward a lower surface of the dicing tape while being in a non-contact state with the dicing tape; an orthogonal robot under the wafer stage, wherein the ejector is on an upper surface of the orthogonal robot; and a controller configured to: control the orthogonal robot and the ejector to move up and down in a first direction; control the orthogonal robot to move in a second direction or a third direction; control the ejector to move in a spiral manner in the second direction and the third direction by controlling the orthogonal robot to move in the spiral manner; and control an ejecting pressure of the gas of the ejector.

20 Claims, 19 Drawing Sheets

(56) References Cited

U.S. PATENT DOCUMENTS

| | | | | |
|---|---|---|---|---|
| 11,244,840 | B2 | 2/2022 | Lee et al. | |
| 2014/0027049 | A1 | 1/2014 | Joo et al. | |
| 2022/0139739 | A1 | 5/2022 | Kim | |
| 2025/0096027 | A1 * | 3/2025 | Mizuta | H10P 72/74 |

FOREIGN PATENT DOCUMENTS

| | | | |
|---|---|---|---|
| KR | 10-2013-0088245 | A | 8/2013 |
| KR | 10-2013-0130391 | A | 12/2013 |
| KR | 10-2016-0068201 | A | 6/2016 |
| KR | 10-2021-0112728 | A | 9/2021 |

* cited by examiner

CHIP EJECTING APPARATUS AND METHOD

CROSS-REFERENCE TO RELATED APPLICATION

This application claims priority from Korean Patent Application No. 10-2024-0024974, filed on Feb. 21, 2024, in the Korean Intellectual Property Office, and all the benefits accruing therefrom under 35 U.S.C. 119, the contents of which in its entirety are herein incorporated by reference.

BACKGROUND

1. Field

Embodiments of the present disclosure relate to a chip ejecting apparatus and method.

2. Description of Related Art

Semiconductor devices may be formed on a wafer by repeatedly performing a series of manufacturing processes on the wafer. The wafer having semiconductor elements formed thereon may include multiple chips (e.g., dies) via a dicing process. Each of the divided chips may be bonded to a substrate (e.g., a printed circuit board (PCB)) in a die attaching process.

A facility for performing the die attaching process may include an ejecting apparatus that separates the chip from the wafer on which the dicing process has been performed, a collet apparatus that picks up the separated chip, and a bonding apparatus that bonds the picked up chip to the substrate.

In this regard, to prevent the chips from coming off during the dicing process, a dicing tape attached to a back of the wafer may be used. Each individualized chip may be peeled off from the dicing tape by an ejecting apparatus.

This ejecting apparatus disposed under the dicing tape pushes the semiconductor chips attached to the dicing tape upward using a needle, a pin, or a block to remove the chips from the dicing tape and allows the removed chips to be picked up by a suction apparatus such as the collet apparatus.

SUMMARY

However, during the die (or chip) pickup process as described above, there was inconvenience of preparing or replacing the ejecting apparatus based on a size or a thickness of each of the semiconductor chips. In this regard, it took a lot of time to replace and fine-tune the ejecting apparatus, thereby lowering productivity.

In this case, due to incorrect application of the needle, the pin, or the block of the ejecting apparatus or non-compliance with a management rule thereof, while the semiconductor chips are peeled from the dicing tape, stress may be applied from the needle, the pin, or the block to the chips, resulting in damage thereto, such that, for example, cracks may occur in the semiconductor chips.

In particular, a miniaturized and thinned semiconductor chip requires improvement in a precision of the ejecting apparatus and optimization of a configuration thereof.

According to embodiments of the present disclosure, a chip ejecting apparatus and method is provided in which a chip is peeled from the dicing tape in a non-contact manner to minimize the stress applied to the chip, thereby improving productivity by reducing or eliminating inconvenience of preparing or replacing an ejecting apparatus based on a size or a thickness of chips.

According to embodiments of the present disclosure, a chip ejecting apparatus may be provided and include: a wafer stage configured to receive a dicing tape and a plurality of chips attached to the dicing tape; an ejector under the wafer stage, the ejector configured to eject gas toward a lower surface of the dicing tape while being in a non-contact state with the dicing tape; an orthogonal robot under the wafer stage, wherein the ejector is on an upper surface of the orthogonal robot; and a controller configured to: control the orthogonal robot and the ejector to move up and down in a first direction; control the orthogonal robot to move in a second direction or a third direction; control the ejector to move in a spiral manner in the second direction and the third direction by controlling the orthogonal robot to move in the spiral manner; and control an ejecting pressure of the gas of the ejector.

According to embodiments of the present disclosure, a chip ejecting apparatus may be provided and include: a wafer stage configured to receive a dicing tape and a plurality of chips attached to the dicing tape; an ejector under the wafer stage, the ejector configured to eject gas toward a lower surface of the dicing tape while being in a non-contact state with the dicing tape; an orthogonal robot under the wafer stage, wherein the ejector is on an upper surface of the orthogonal robot; and a controller configured to: control the orthogonal robot and the ejector to move up and down in a first direction; control the orthogonal robot to move in a second direction or a third direction; control the ejector to move in a spiral manner in the second direction and the third direction by controlling the orthogonal robot to move in the spiral manner; and control an ejecting pressure of the gas of the ejector. The controller may be further configured to: vary a contact area of the gas with a lower surface of the dicing tape by adjusting a vertical dimension by which the ejector moves up and down; control the orthogonal robot to move in the spiral manner from a position vertically overlapping with a corner of a chip, from among the plurality of chips, at one side of an edge area of the chip to a central area, along the second direction and the third direction, of the chip such that the ejector on the orthogonal robot moves in the spiral manner; control the ejector, while in a state in which the ejector has been raised in the first direction by the orthogonal robot, to eject the gas toward the dicing tape while moving the ejector in the spiral manner such that the chip is peeled from the dicing tape sequentially from the corner of the chip to the central area of the chip, and wherein the chip has a concave shape just before the gas is ejected from the ejector towards the central area of the chip.

According to embodiments of the present disclosure, a chip ejecting method performed by a controller of a chip ejecting apparatus may be provided. The chip ejecting method may include: moving an orthogonal robot of the chip ejecting apparatus to a position vertically overlapping with, in a first direction, an edge area of a lower surface of a chip such that an ejector on the orthogonal robot moves to the position, wherein the chip is on a dicing tape; adjusting a vertical level of the ejector to vary a contact area of gas with a lower surface of the dicing tape; moving the orthogonal robot in a spiral manner from a position vertically overlapping with a corner of the chip to a position adjacent to a central area, along a second direction and a third direction, of the chip such that the ejector moves in the spiral manner;

ejecting, by the ejector, the gas to the dicing tape while the ejector moves in the spiral manner; moving, after the ejector moves in the spiral manner, the orthogonal robot to a position vertically overlapping with the central area of the chip such that the ejector moves to the position vertically overlapping with the central area; moving a collet apparatus downwardly in the first direction; and ejecting, by the ejector, the gas to the central area of the chip, thereby peeling the chip from the dicing tape such that the collet apparatus is able to suction and pick up the chip in the first direction.

Aspects of embodiments of present disclosure are not limited to those mentioned above and additional aspects of embodiments of the present disclosure, which are not mentioned herein, will be clearly understood by those skilled in the art from the following description of the present disclosure.

BRIEF DESCRIPTION OF DRAWINGS

The above and other aspects and features of embodiments of the present disclosure will become more apparent by describing in detail non-limiting example embodiments of the present disclosure with reference to the attached drawings, in which.

DETAILED DESCRIPTIONS

Figure 1:
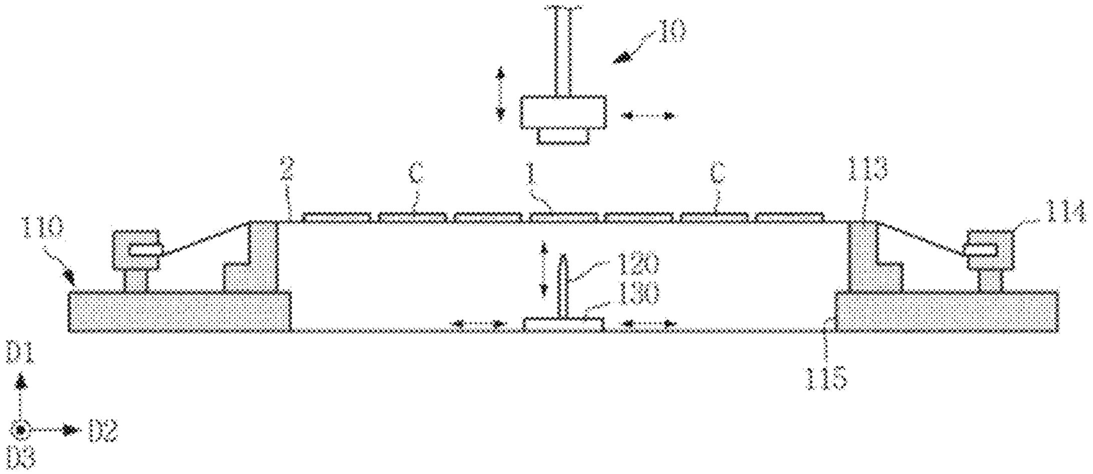
FIG. 1 is a cross-sectional view schematically showing a chip ejecting apparatus according to some embodiments of the present disclosure.

Non-limiting example embodiments of the present disclosure will hereinafter be described in detail with reference to the accompanying drawings. Advantages and features of embodiments of the present disclosure, and the methods to achieve them, will become clear by referring to non-limiting example embodiments detailed with the accompanying drawings. However, the present disclosure is not limited to the example embodiments described below and embodiments of the present disclosure can be implemented in various different forms. These non-limiting example embodiments are provided to make the disclosure of the present disclosure complete and to fully inform those skilled in the art to which the present disclosure pertains. Throughout the specification, the same reference numerals denote the same components.

Terms used in this specification are for the purpose of describing particular example embodiments only and are not intended to be limiting of the present disclosure. In this specification, singular forms are intended to include plural forms as well, unless the context clearly indicates otherwise. The terms “comprises” (or “includes”) and/or “comprising” (or “including”) when used in this specification, specify the presence of stated features, steps, operations, elements, and/or components, but do not preclude the presence or addition of one or more other features, steps, operations, elements, components, and/or groups thereof.

It will be understood that when an element or layer is referred to as being “on,” “connected to,” or “coupled to” another element or layer, it can be directly on, connected to, or coupled to the other element or layer or intervening elements or layers may be present. In contrast, when an element or layer is referred to as being “directly on,” “directly connected to,” or “directly coupled to” another element or layer, there are no intervening elements or layers present.

Figure 2:
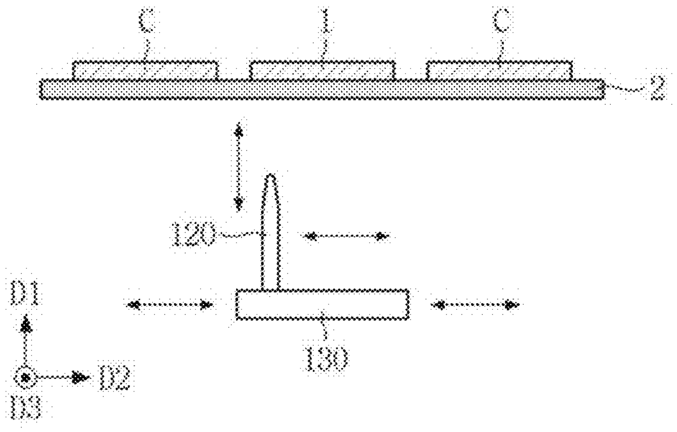
FIG. 2 is a schematic cross-sectional view for illustrating a chip ejecting apparatus according to some embodiments of the present disclosure.

FIG. 1 is a cross-sectional view schematically showing a chip ejecting apparatus according to some embodiments of the present disclosure. FIG. 2 is a schematic cross-sectional view for illustrating a chip ejecting apparatus according to some embodiments of the present disclosure.

Referring to FIG. 1 and FIG. 2, a chip ejecting apparatus according to some embodiments of the present disclosure may include a wafer stage 110, an ejecting unit 120 (e.g., an ejector), an orthogonal robot 130, and a controller 240.

In this regard, a first direction D1 is a height direction and is a direction perpendicular to a plane defined by a second direction D2 and a third direction D3. The first direction D1 may be a vertical direction. The second direction D2 and the third direction D3 may define a plane in a horizontal direction. The second direction D2 may be a front-back direction, and the third direction D3 may be a left-right direction. Alternatively, the second direction D2 may be a left-right direction, and the third direction D3 may be a front-back direction.

The wafer stage 110 receives a dicing tape 2 and multiple chips C attached on the dicing tape 2. In other words, the wafer stage 110 receives the dicing tape 2 and the semiconductor chips C, into which the wafer W has been divided in the dicing process, and which are attached to the dicing tape 2.

The wafer stage 110 may include a frame 114. The dicing tape 2 to which the multiple chips C have been attached may be fixed to the frame 114. For example, the frame 114 may have a circular shape along the second direction D2 and the third direction D3 (e.g., when viewed in a plan view). The frame 114, that is circular, may be disposed along an edge of the dicing tape 2 so as to secure the dicing tape 2 thereto.

The wafer stage 110 may further include a support 113. The support 113 may support a position near an edge of the dicing tape 2. The frame 114 of the wafer stage 110 may be lowered along the first direction D1. Since the position near the edge of the dicing tape 2 may be supported by the support 113, the dicing tape 2 may expand outwardly in the second direction D2 and the third direction D3 as the frame 114 is lowered. The dicing tape 2, that is expanded, may allow the multiple chips C to be more easily removed from the dicing tape 2.

The wafer stage 110 may include a space 115 defined therein. In the space 115 formed in the wafer stage 110, the orthogonal robot 130, and the ejecting unit 120 disposed on an upper surface of the orthogonal robot 130 in the first direction D1, may be disposed to be movable along the second direction D2 or the third direction D3.

Figure 3:
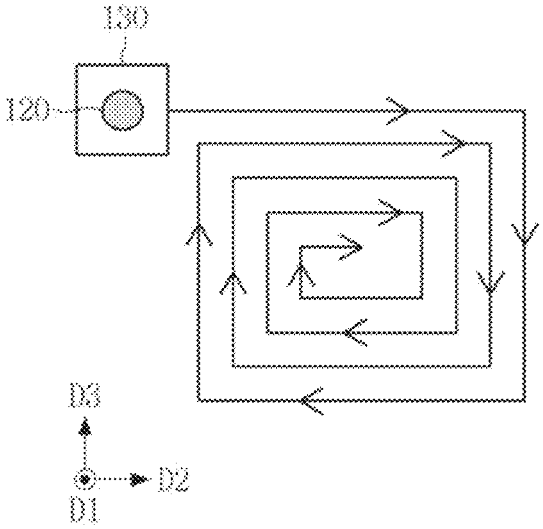
FIG. 3 and FIG. 4 are cross-sectional views schematically shown to illustrate that an ejecting unit of the chip ejecting apparatus according to some embodiments of the present disclosure ejects gas while moving in a spiral manner.
Figure 4:
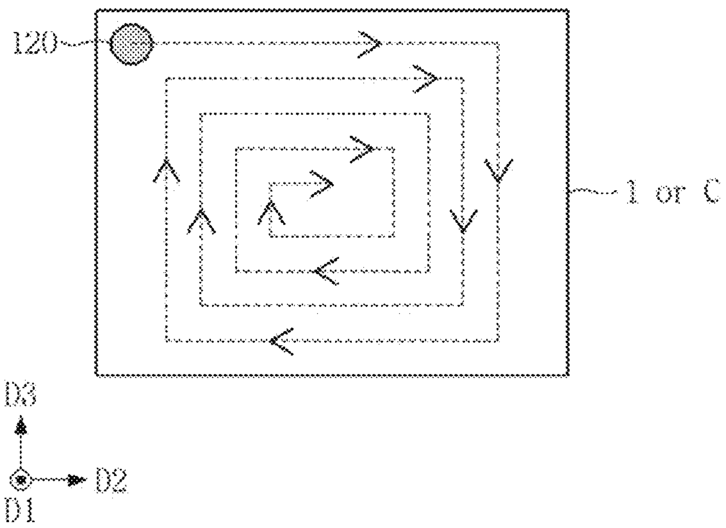
Figure 5:
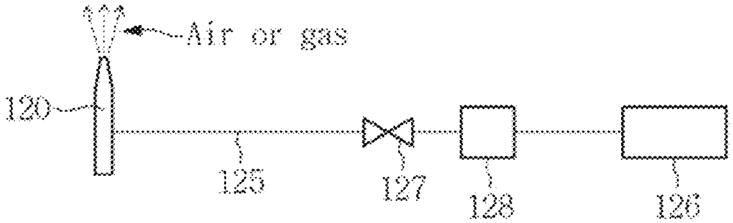
FIG. 5 is a schematic diagram for illustrating a configuration in which the ejecting unit of the chip ejecting apparatus according to some embodiments of the present disclosure ejects gas.
Figure 6:
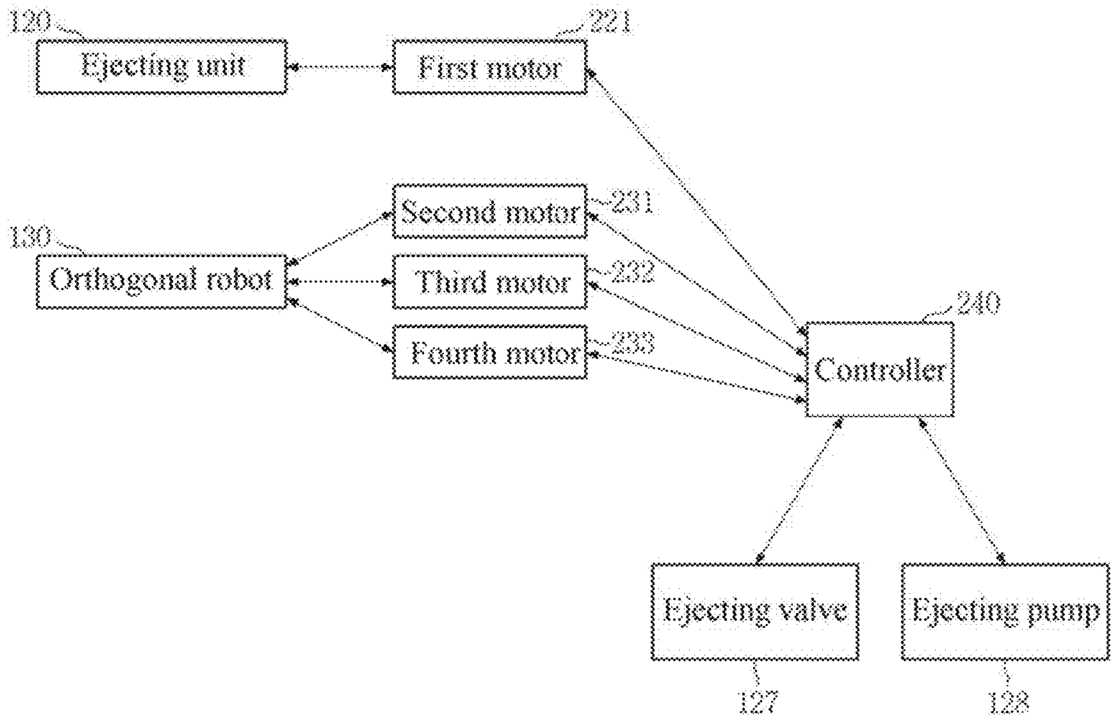
FIG. 6 is a schematic diagram for illustrating a controller of the chip ejecting apparatus according to some embodiments of the present disclosure.

FIG. 3 and FIG. 4 are cross-sectional views schematically shown to illustrate that the ejecting unit of the chip ejecting apparatus according to some embodiments of the present disclosure ejects gas while moving in a spiral manner. FIG. 5 is a schematic diagram for illustrating a configuration in which the ejecting unit of the chip ejecting apparatus according to some embodiments of the present disclosure ejects gas. FIG. 6 is a schematic diagram for illustrating a controller of the chip ejecting apparatus according to some embodiments of the present disclosure.

Referring to FIG. 1 to FIG. 6, the ejecting unit 120 is configured to ascend or descend in the first direction D1 by the orthogonal robot 130 while being disposed under the wafer stage 110. The ejecting unit 120 ejects gas (e.g., air) toward a lower surface of the dicing tape 2 in a non-contact state therewith. Thus, the stress applied to the chip C during the process of peeling the chip C from the dicing tape 2 may be minimized.

The ejecting unit 120 may have a cylindrical shape. However, embodiments of the present disclosure are not limited thereto. For example, the ejecting unit 120 may be provided in a form of a pillar having a polygonal cross-section such as a square, a hexagon, or an octagon along the second direction D2 and the third direction D3 (e.g., when viewed in a plan view). The ejecting unit 120 may have a sharp top along the first direction D1. The ejecting unit 120 may have a shape in which a width of a top thereof is smaller than a width of a bottom thereof along the first direction D1.

The ejecting unit 120 may have an ejecting hole defined therein. The ejecting hole may extend through the ejecting unit 120 along the first direction D1. The ejecting hole may extend from a bottom of the ejecting unit 120 along the first direction D1 upwardly by a certain vertical dimension. The ejecting hole may have a shape of an ejecting tube.

The ejecting hole may be connected to an gas supply 126. The ejecting hole may be connected to the gas supply 126 via an ejecting tube 125. The ejecting tube 125 may be configured to include a passage therein in which gas may move. An ejecting pump 128 may be provided on the ejecting tube 125.

The ejecting pump 128 may be disposed on the ejecting tube 125 between the ejecting unit 120 and the gas supply 126, such as to be configured to move the gas from the gas supply to the ejecting unit 120. The ejecting pump 128 may operate under control of a controller 240. The ejecting pump 128 may eject gas (e.g., air) through the ejecting hole at a number of pressures preset under the control of the controller 240. Thus, the chip C attached to the dicing tape 2 may be peeled off from the dicing tape 2.

Furthermore, the ejecting pump 128 may eject the gas at a number of preset pressures such that the gas (e.g., air) is ejected at an appropriate pressure suitable for each of sizes of various chips C to increase peel-off efficiency. Thus, productivity may be improved.

An ejecting valve 127 may be provided on the ejecting tube 125. The ejecting valve 127 may be configured to be opened and closed and may be disposed on the ejecting tube 125 between the ejecting unit 120 and the ejecting pump 128, such as to be configured to allow and disallow flow of the gas from the ejecting pump 128 to the ejecting unit 120. The ejecting valve 127 may operate under the control of the controller 240. When the ejecting valve 127 is opened due to the control of the controller 240, the gas may be ejected to the tape 2 through the ejecting hole of the ejecting unit 120, such that the chip C attached to the dicing tape 2 may be peeled off from the dicing tape 2.

The ejecting pump 128 and the ejecting valve 127 communicatively connected to the ejecting hole operate under the control of the controller 240. For example, when a collet apparatus 10 is intended to pick up a pick-up target chip 1 (refer to FIGS. 8-12 and 17-18), the controller 240 may operate the ejecting pump 128 and open the ejecting valve 127 at the same time. When the orthogonal robot 130 on which the ejecting unit 120 is disposed moves in the second direction D2 or the third direction D3 in order to pick up another chip C (e.g., due to the control of the controller 240), the operation of the ejecting pump 128 may be stopped and the ejecting valve 127 may be closed at the same time due to the control of the controller 240.

The ejecting unit 120 may be provided on an upper surface of the orthogonal robot 130. The ejecting unit 120 may move up and down along the first direction D1 by the orthogonal robot 130 while being disposed on the upper surface of the orthogonal robot 130. The ejecting unit 120 may be connected to a driving power supply to provide a vertical movement driving force. The driving power supply may be connected to the orthogonal robot 130 to move up and down the ejecting unit 120. The driving power supply may be embodied as a cylinder connected to a first motor 221. However, embodiments of the present disclosure are not limited thereto, and the driving power supply may be embodied as various types of power supply means such as an actuator or a linear motion (LM) guide or may be configured to include various power transmission elements.

The driving power supply may operate under the control of the controller 240. For example, the controller 240 may be connected to the first motor 221. The controller 240 may change a contact area of the gas ejected onto the lower surface of the dicing tape 2 by adjusting a vertical distance by which the ejecting unit 120 moves up or down using the driving power supply including the first motor 221. For example, the controller 240 may adjust a vertical position of the ejecting unit 120. This approach may deal with various sizes of the chips C, thereby not only increasing the peeling efficiency of the chip C but also improving the productivity.

The ejecting unit 120 may be raised along the first direction D1 by the orthogonal robot 130 while being located under the pick-up target chip 1. The orthogonal robot 130, on which the ejecting unit 120 is disposed, may move to a position under the pick-up target chip 1 along the second direction D2 or the third direction D3. While the orthogonal robot 130 is disposed at a correct position under the pick-up target chip 1, the ejecting unit 120 may move to a position vertically overlapping with a corner at one side of an edge area of a lower surface, in the first direction D1, of the pick-up target chip 1 as the orthogonal robot 130 moves in the second direction D2 and the third direction D3. The ejecting unit 120 may move up along the first direction D1 by the orthogonal robot 130 while having moved to the position vertically overlapping with the corner at the one side of the edge area of the lower surface of the pick-up target chip 1. The ejecting unit 120 may eject the gas to the lower surface of the pick-up target chip 1 while having been raised along the first direction D1. While the ejecting unit 120 ejects the gas to the lower surface of the pick-up target chip 1, the ejecting unit 120 may move in a spiral manner from the position vertically with overlapping the corner at the one side of the edge area of the lower surface of the pick-up target chip 1 to a central area along the second direction D2 and the third direction D3 of the lower surface of the pick-up target chip 1 due to the horizontal movement of the orthogonal robot 130. As the ejecting unit 120 ejects the gas to the lower surface of the pick-up target chip 1 while the ejecting unit 120 is moving in the spiral manner due to the movement of the orthogonal robot 130 in the second direction D2 and the third direction D3, the pick-up target chip 1 may be peeled off from the dicing tape 2. Thus, the collet apparatus 10 may suction and pick up the peeled-off target chip 1 while being disposed on top of the pick-up target chip 1 in the first direction D1.

For example, the chip C may be peeled off from the dicing tape 2 sequentially along a path from the corner at one side of the edge area of the chip C to the central area of the chip C. The chip C may have a concave shape just before the gas is ejected to the central area of the lower surface of the chip C from the ejecting unit 120.

FIG. 7 to FIG. 10 are cross-sectional views schematically showing a process in which a chip ejecting apparatus according to some embodiments of the present disclosure peels off a chip from a dicing tape and the collet apparatus picks up the peeled chip.

Referring to FIG. 1 to FIG. 10, the orthogonal robot 130 may be configured to move while being disposed under the wafer stage 110. The orthogonal robot 130 may be disposed under the space 115 of the wafer stage 110. The orthogonal robot 130 may be configured to move in the second direction D2 or the third direction D3. Due to the movement of the orthogonal robot 130 in the second direction D2 or the third direction D3, the ejecting unit 120 may move in the spiral manner while being disposed under the dicing tape 2 in the first direction D1. The orthogonal robot 130 may move the ejecting unit 120 up and down in the first direction D1. The orthogonal robot 130 may be disposed under the dicing tape 2 along the first direction D1. The upper surface of the orthogonal robot 130 may face the lower surface of the dicing tape 2.

The orthogonal robot 130 may have a block shape with a rectangular cross section corresponding to a shape of the chip C along the second direction D2 and the third direction D3 (e.g., when viewed in a plan view). The orthogonal robot 130 may be provided in a shape having a cross-sectional area size corresponding to a cross-section area size of the chip C along the second direction D2 and the third direction D3 (e.g., when viewed in a plan view).

The ejecting unit 120 may be disposed on the upper surface of the orthogonal robot 130. The ejecting unit 120 may be disposed on the orthogonal robot 130 so as to be movable in the first direction D1. The orthogonal robot 130 may move in the spiral manner along the second direction D2 and the third direction D3 so that the ejecting unit 120 moves in the spiral manner.

The orthogonal robot 130 may be provided with the driving power supply connected to the ejecting unit 120 to provide the vertical movement driving force to the ejecting unit 120.

The orthogonal robot 130 may be connected to a separate driving power supply that provides power thereto so that the orthogonal robot 130, and thus the ejecting unit 120, move in the spiral manner. The driving power supply may include a second motor 231 that moves the orthogonal robot 130 in the second direction D2. The driving power supply may include a third motor 232 that moves the orthogonal robot 130 in the third direction D3.

For example, the driving power supply may include a plurality of LM guides respectively connected to a plurality of second motors 231. Furthermore, the driving power supply may include a plurality of LM guides respectively connected to a plurality of third motors 232. However, embodiments of of the present disclosure are not limited thereto, and the driving power supply may take various forms of power provision means, or may be configured to include various power transmission elements.

The orthogonal robot 130 may be disposed in the space 115 under the wafer stage 110 and may be connected to a separate driving power supply to receive a driving power to move the orthogonal robot 130 in the second direction D2 or the third direction D3. The driving power supply may include a plurality of LM guides respectively connected to a plurality of fourth motors 233. However, embodiments of the present disclosure are not limited thereto, and the driving power supply may take various forms of power providing means such as a cylinder or an actuator connected to each of the plurality of fourth motors 233, or may be configured to include various power transmission elements.

Figure 7:
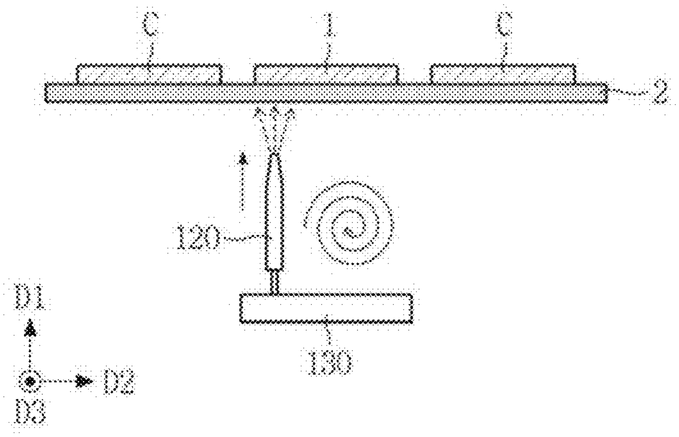
FIG. 7 to FIG. 10 are cross-sectional views schematically showing a process in which a chip ejecting apparatus according to some embodiments of the present disclosure peels off a chip from a dicing tape and a collet apparatus picks up the chip.
Figure 8:
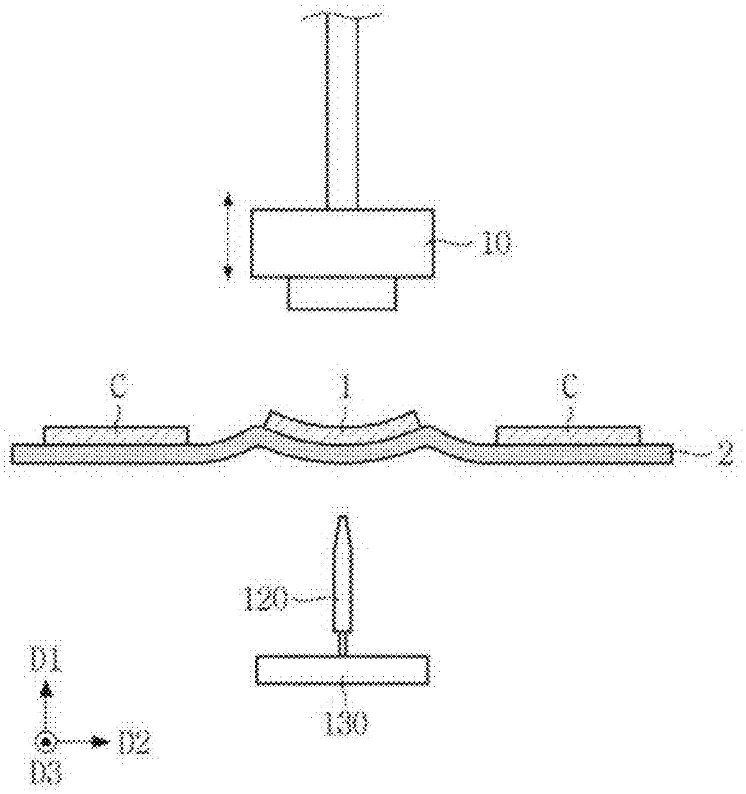

In one example, with reference to FIG. 4 and FIG. 7, the ejecting unit 120 disposed on the upper surface of the orthogonal robot 130 may move in the spiral manner, due to movement of the orthogonal robot 130, from the position vertically overlapping with the corner at the one side of the edge area of the chip C to the central area of the chip C in the second direction D2 and the third direction D3.

That is, in a state where the orthogonal robot 130 has moved in the second direction D2 or the third direction D3 by the driving power supply including the fourth motor 233 to reach a correct position under the pick-up target chip 1, the orthogonal robot 130 may move in the spiral form along the second direction D2 and the third direction D3 by the driving power supply including the second motor 231 and the third motor 232 while being disposed under the pick-up target chip 1 along the first direction D1. During this spiral movement, the ejecting unit 120 ejects the gas to the lower surface of the pick-up target chip 1. Specifically, with reference to FIG. 8 and FIG. 9, while the ejecting unit 120 moves in the spiral manner from the position vertically overlapping with the corner at the one side of the edge area of the lower surface of the pick-up target chip 1 to the central area of the pick-up target chip 1 along the second direction D2 and the third direction D3, the ejecting unit 120 ejects the gas to the lower surface of the pick-up target chip 1.

Figure 9:
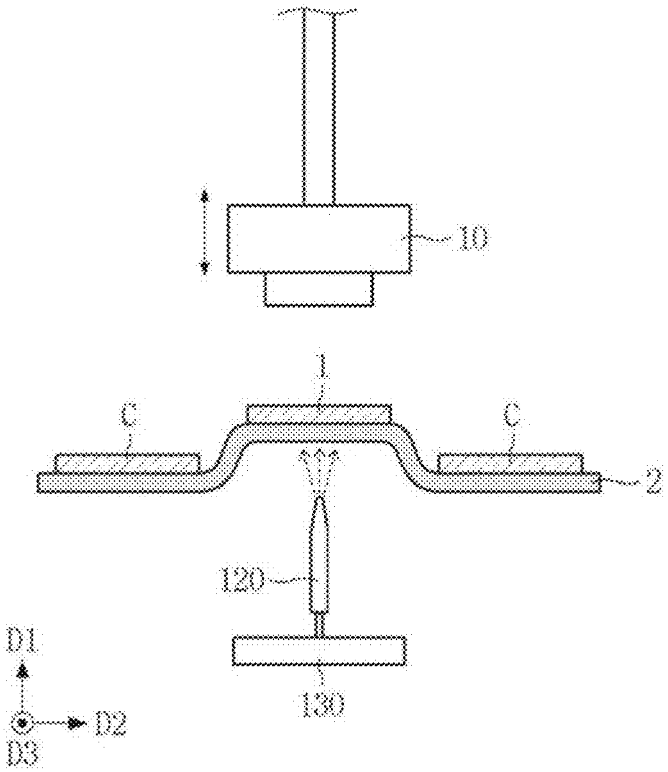
Figure 10:
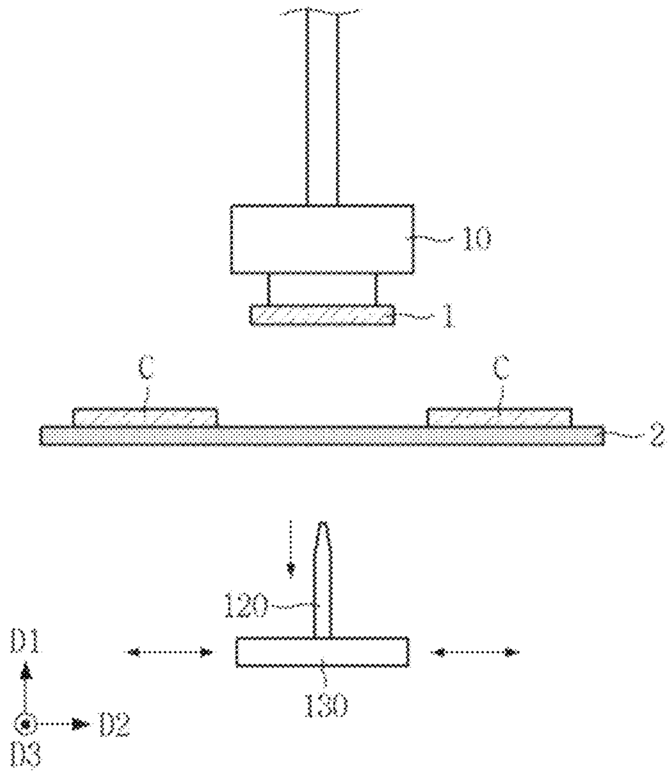

Accordingly, with reference to FIG. 9 and FIG. 10, even when the ejecting unit 120 is not in contact with the dicing tape 2, the pick-up target chip 1 may be peeled off from the dicing tape 2 such that the collet apparatus 10 may suction and pick up the pick-up target chip 1 upwardly in the first direction D1.

The controller 240 may control the vertical movement and the spiral movement of the ejecting unit 120 and an ejecting pressure of the gas. Furthermore, the controller 240 may control the movement of the orthogonal robot 130 in the second direction D2 and the third direction D3.

For example, the controller 240 may control the driving power supply including the first motor 221. Thus, the controller 240 may control the vertical movement of the ejecting unit 120 due to the vertical movement of the orthogonal robot 130 and at the same time may adjust a vertical dimension by which the ejecting unit 120 moves vertically to vary the contact area of the gas ejected on the lower surface of the dicing tape 2 with the lower surface of the dicing tape. This scheme may deal with various sizes of the chips C, thereby increasing the peeling efficiency of the chip C and improving the productivity.

The controller 240 may control the ejecting pump 128. The controller 240 may control the ejecting pump 128 to eject the gas through the ejecting hole at a number of preset pressures. Thus, the gas may be ejected at an appropriate pressure suitable for the size of each of the various chips C, thereby increasing peeling efficiency. Thus, the productivity may be improved.

The controller 240 may also control the ejecting valve 127 and the ejecting pump 128. Accordingly, when the collet apparatus 10 is intended to pick up the pick-up target chip 1, the controller 240 may operate the ejecting pump 128 and open the ejecting valve 127 at the same time. When the orthogonal robot 130 moves in the second direction D2 or the third direction D3 in order to pick up another chip C, the controller 240 may control the ejecting pump 128 to stop operating and may control the ejecting valve 127 to close at the same time.

The controller 240 may be connected to and control the driving power supply including the second motor 231. Furthermore, the controller 240 may be connected to and control the driving power supply including a third motor 232. Thus, the controller 240 may control the orthogonal robot 130, and the ejecting unit 120 disposed on the upper surface of the orthogonal robot 130, to move from the position vertically overlapping with the corner at the one side of the edge area of the lower surface of the chip C in the spiral manner along the second direction D2 and the third direction D3.

For example, the controller 240 may control the orthogonal robot 130 to move from the position vertically overlapping with the corner at the one side of the edge area of the lower surface of the chip C in a following spiral manner: a positive direction (e.g., right) of the second direction D2, a negative direction (e.g., back) of the third direction D3, a negative direction (e.g., left) of the second direction D2, a positive direction (e.g., forward) of the third direction D3, and iterate.

The controller 240 may be connected to and control the driving power supply including the fourth motor 233. Thus, the controller 240 may control the orthogonal robot 130 to move in the second direction D2 or the third direction D3 to reach a position under the pick-up target chip 1 while the orthogonal robot 130 is positioned in the space 115 of the wafer stage 110 under the dicing tape 2. Then, with reference to FIG. 9 and FIG. 10, the ejecting unit 120 may eject the gas onto the pick-up target chip 1 such that the pick-up target chip 1 is removed from the dicing tape 2 so that the collet apparatus 10 may pick up the pick-up target chip 1 that is removed.

Hereinafter, a chip ejecting apparatus according to some embodiments of the present disclosure is described with reference to FIG. 11 and FIG. 12. The following description focuses on differences thereof from the chip ejecting apparatus described with reference to FIG. 1 to FIG. 10, and repeated descriptions thereof may be omitted.

Figure 11:
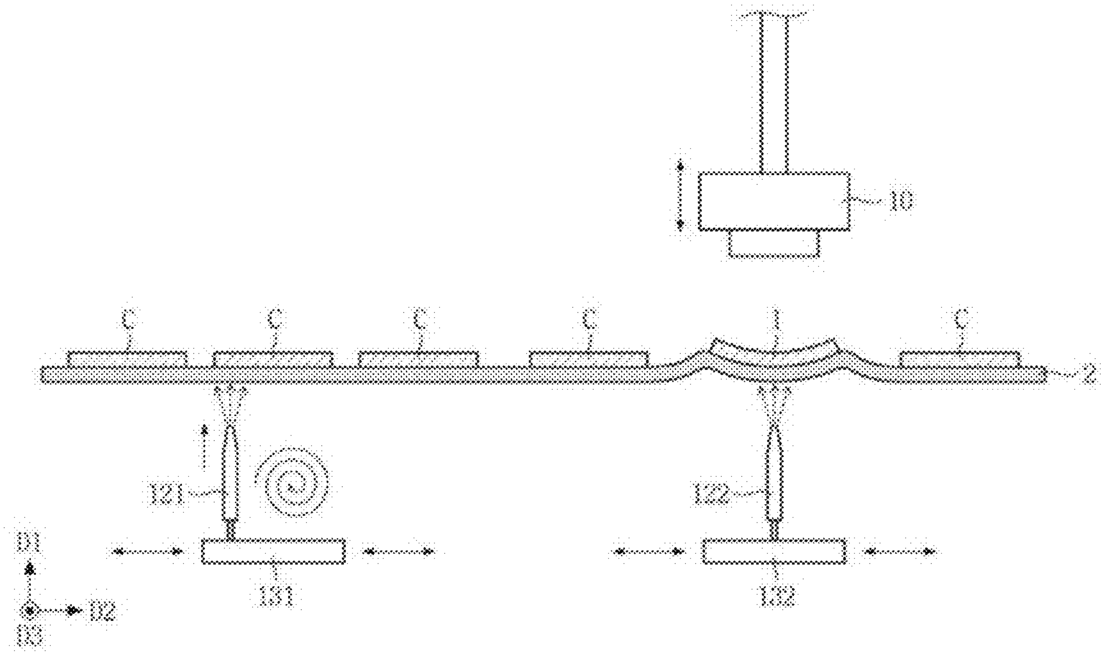
FIG. 11 and FIG. 12 are schematic cross-sectional views for illustrating a process in which a chip is removed from a dicing tape using a chip ejecting apparatus according to some embodiments of the present disclosure.
Figure 12:
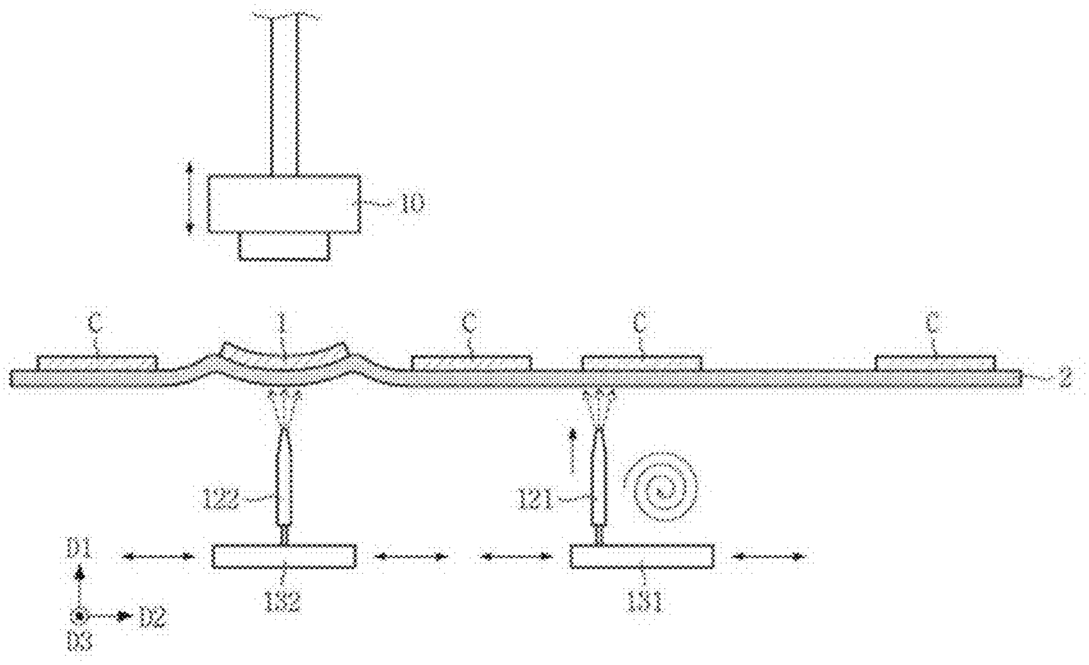
Figure 13:
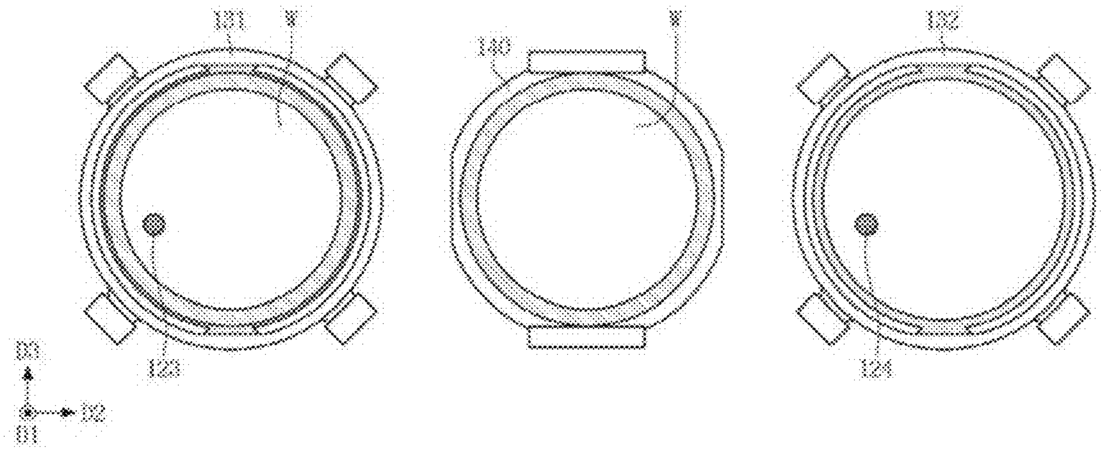
FIG. 13 to FIG. 18 are schematic cross-sectional views for illustrating a process in which a chip is removed from a dicing tape using a chip ejecting apparatus according to some embodiments of the present disclosure.
Figure 14:
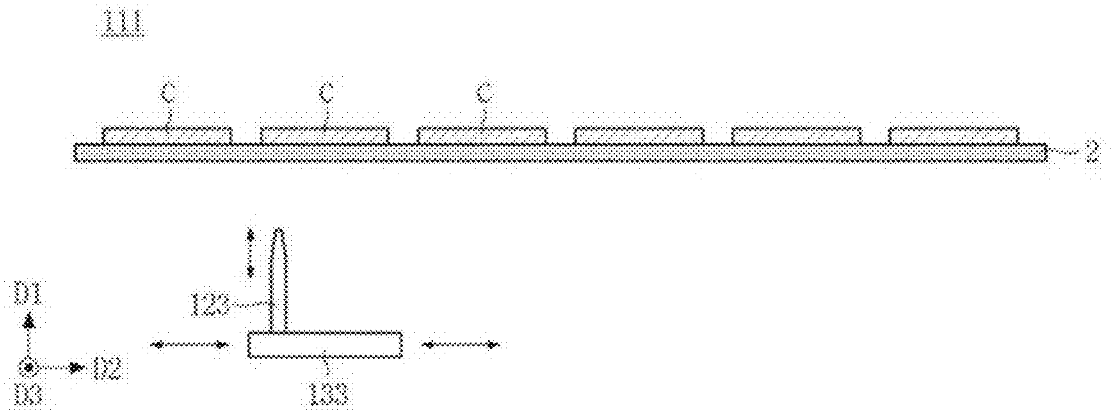
Figure 15:
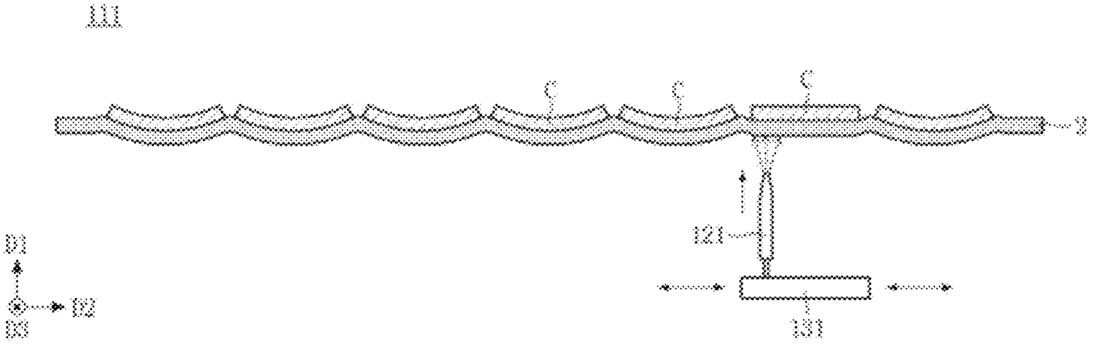
Figure 16:
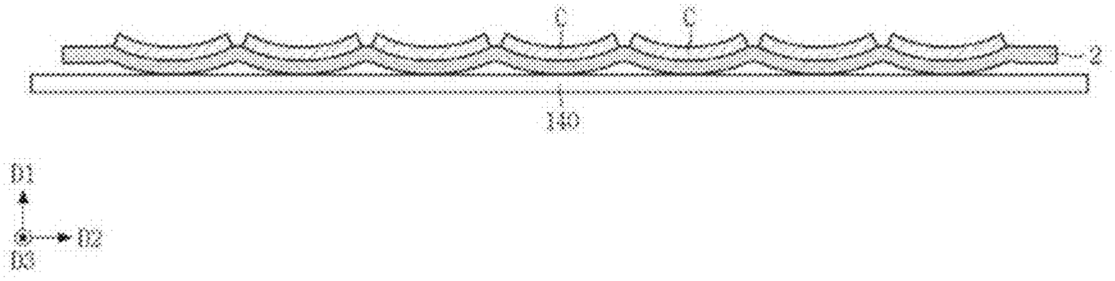
Figure 17:
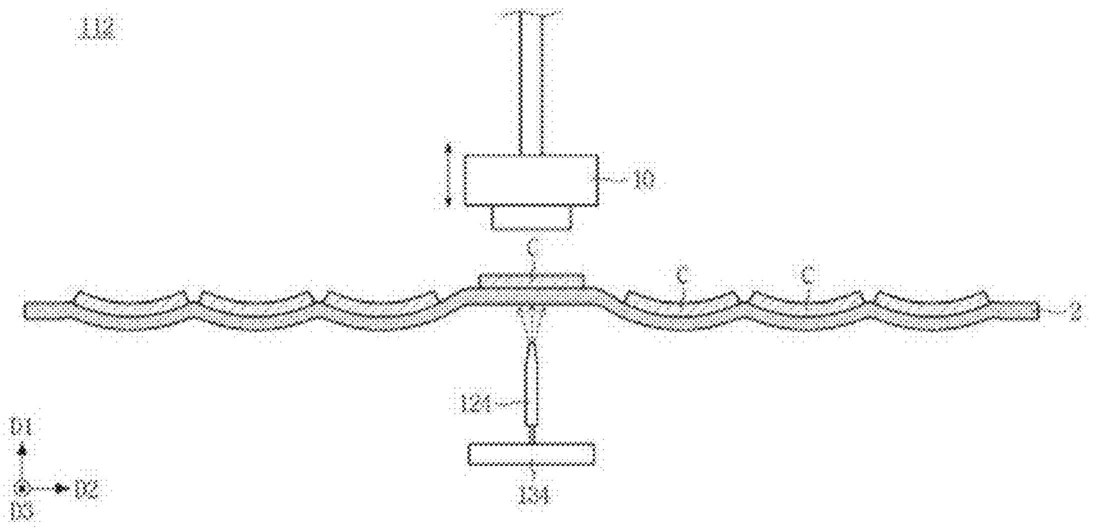
Figure 18:
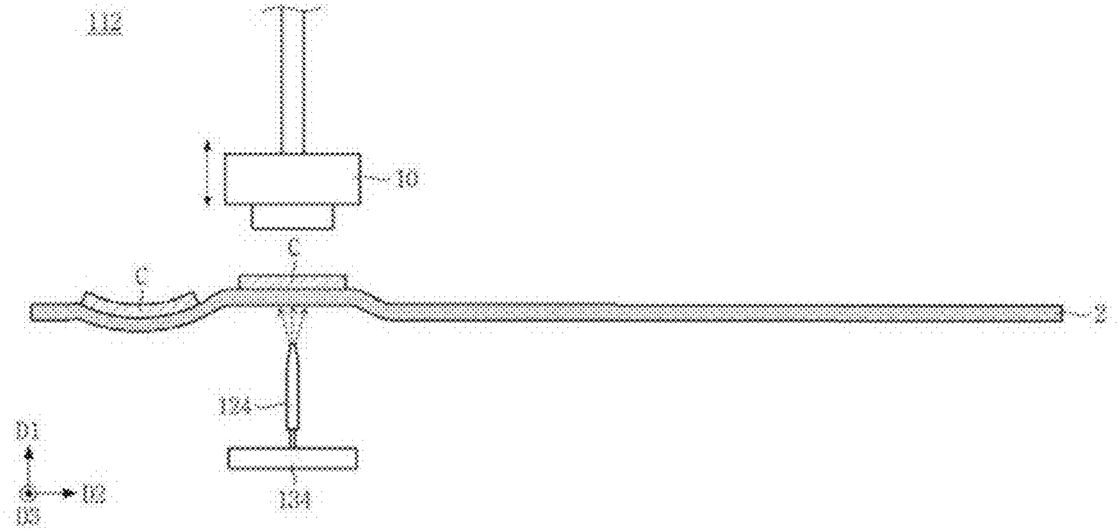

FIG. 11 and FIG. 12 are schematic cross-sectional views for illustrating a process in which a chip is removed from a dicing tape using a chip ejecting apparatus according to some embodiments of the present disclosure in which an ejecting unit includes sub-ejecting units and an orthogonal robot includes sub-orthogonal robots, and the removed chip is picked up with a collet apparatus.

Referring to FIG. 11 and FIG. 12, in the chip ejecting apparatus according to some embodiments of the present disclosure, the ejecting unit 120 may include one or more first ejecting units 121 and one or more second ejecting units 122.

Furthermore, the orthogonal robot 130 may include one or more first orthogonal robots 131 corresponding to the one or more first ejecting units 121, and one or more second orthogonal robots 132 corresponding to the one or more second ejecting units 122. For example, the one or more first ejecting units 121 may be on the one or more first orthogonal robots 131, and the one or more second ejecting units 122 may be on the one or more second orthogonal robots 132.

Due to the control of the controller 240, the first orthogonal robot 131 and the second orthogonal robot 132 may move in the second direction D2 or the third direction D3 so as not to interfere with each other while being positioned in the space 115 of the wafer stage 110.

The first orthogonal robot 131 and the second orthogonal robot 132 may sequentially move to a position under the pick-up target chip 1 due to the control of the controller 240. In this regard, in order to prevent mutual interference between the first orthogonal robot 131 and the second orthogonal robot 132 during the movement of the first orthogonal robot 131 and the second orthogonal robot 132, the controller 240 may set a next pick-up target chip as a chip C attached to the dicing tape 2 at a position not adjacent to the pick-up target chip 1.

In other words, the controller 240 may set the next pick-up target chip (e.g., the chip C) in a non-sequential manner. For example, the controller 240 may set the next pick-up target chip (e.g., the chip C) in a random pattern such that the next pick-up target chip (e.g., the chip C) is not adjacent to the pick-up target chip 1. For example, at least one chip may be between the next pick-up target chip (e.g., the chip C) and the pick-up target chip 1.

The first orthogonal robot 131 may move in the spiral manner in the second direction D2 and the third direction D3 so that the first ejecting unit 121 disposed on the upper surface on the first orthogonal robot 131 moves, in the spiral manner, from a position vertically overlapping with the corner at one side of the edge area of the lower surface of the chip C to an outer area adjacent to the central area of the chip C in the second direction D2 and the third direction D3.

That is, in a remaining area of the chip C excluding the central area of the chip C, the first orthogonal robot 131 moves in the spiral manner from the position vertically overlapping the corner at one side of the edge area of the lower surface of the chip to the outer area adjacent to the central area of the chip C in the second direction D2 and the third direction D3. Thus, the first ejecting unit 121 ejects the gas to the remaining area of the chip C excluding the central area of the chip C while moving in the spiral manner in the remaining area. Accordingly, when the spiral movement of the first ejecting unit 121 according to the spiral movement of the first orthogonal robot 131 has been completed, the pick-up target chip 1 (or the chip C) may have a concave shape.

The second ejecting unit 122 may be positioned in a central area, along the second direction D2 and the third direction D3, of the second orthogonal robot 132 so as to overlap with the central area of the chip C.

That is, while the second ejecting unit 122 has been displaced to a position under a position of the dicing tape 2 to which the pick-up target chip 1 is attached due to the movement of the second orthogonal robot 132 in the second direction D2 or the third direction D3, the second ejecting unit 122 may eject the gas only to the central area of the pick-up target chip 1 on which the ejecting work of the first ejecting unit 121 has been completed and which has the concave shape so that the pick-up target chip 1 may be peeled off from the dicing tape.

Specifically, the first orthogonal robot 131 moves in a spiral manner along the second direction D2 and the third direction D3 due to the control of the controller 240. Thus, while the first ejecting unit 121 mounted on the first orthogonal robot 131 moves in a spiral manner, the first ejecting unit 121 ejects the gas onto the lower surface of the pick-up target chip 1. Then the first orthogonal robot 131 moves to a position under the next pick-up target chip (e.g., the chip C).

At the same time when the first orthogonal robot 131 starts to move to or has moved to the position under the next pick-up target chip (e.g., the chip C), the second orthogonal robot 132 moves to a position under the pick-up target chip 1 on which the first ejecting unit 121 mounted on the first orthogonal robot 131 has completed the ejecting work. The second ejecting unit 122 mounted on the second orthogonal robot 132 ejects the gas only to the central area, in the second direction D2 and the third direction D3, of the lower surface of the pick-up target chip 1 so that the pick-up target chip 1 may be peeled off from the dicing tape 2 and thus may be picked up by the collet apparatus 10.

In this regard, the first orthogonal robot 131 and the second orthogonal robot 132 may move to the position under the pick-up target chip 1 in a sequential manner. In this regard, in order to prevent mutual interference between the first orthogonal robot 131 and the second orthogonal robot 132 during the movement of the first orthogonal robot 131 and the second orthogonal robot 132, the controller 240 may set the next pick-up target chip as a chip C attached to the dicing tape 2 at a position not adjacent to the pick-up target chip 1.

As described above, in the chip ejecting apparatus according to some embodiments of the present disclosure, at least two ejecting units 120 and at least two orthogonal robots 130 may be installed in the space 115 of the wafer stage 110. Thus, the peeling efficiency of the chip C from the dicing tape 2 and the pickup efficiency of the chip C using the collet apparatus 10 may be improved such that the productivity of the semiconductor chip C may be improved.

Hereinafter, a chip ejecting apparatus according to some embodiments of the present disclosure is described with reference to FIG. 13 to FIG. 18. The following description focuses on differences thereof from the chip ejecting apparatuses as shown in FIG. 1 to FIG. 10.

FIG. 13 to FIG. 18 are schematic cross-sectional views for illustrating a process in which a chip is removed from a dicing tape using a chip ejecting apparatus according some embodiments of the present disclosure in which a wafer stage include sub-wafer stages, an ejecting unit includes sub-ejecting units, and an orthogonal robot includes sub-orthogonal robots, and the removed chip is picked up with a collet apparatus.

Referring to FIG. 13 to FIG. 18, in the chip ejecting apparatus according some embodiments of the present disclosure, the wafer stage 110 may include a first wafer stage 111 and a second wafer stage 112.

Furthermore, the ejecting unit 120 may include one or more third ejecting units 123 disposed in a space of the first wafer stage 111 and one or more fourth ejecting units 124 disposed in a space of the second wafer stage 112.

Furthermore, the orthogonal robot 130 may include one or more third orthogonal robots 133 corresponding to the one or more third ejecting units 123, and one or more fourth orthogonal robots 134 corresponding to the one or more fourth ejecting units 124. For example, the one or more third ejecting units 123 may be on the one or more third orthogonal robots 133, and the one or more fourth ejecting units 124 may be on the one or more fourth orthogonal robots 134.

The third orthogonal robot 133 and the fourth orthogonal robot 134 may move in the second direction D2 or the third direction D3 in the space of the first wafer stage 111 and the space of the second wafer stage 112, respectively, due to the control of the controller 240.

The third orthogonal robot 133 may move in the spiral manner in the second direction D2 and the third direction D3 so that the third ejecting unit 123 disposed on the upper surface of the third orthogonal robot 133 moves, in the spiral manner, from a position vertically overlapping with the corner at one side of the edge area of the lower surface of the chip C to an outer area adjacent to the central area of the chip C in the second direction D2 and the third direction D3.

That is, in a remaining area excluding the central area of the chip C, the third orthogonal robot 133 moves in the spiral manner from the position vertically overlapping with the corner at one side of the edge area of the lower surface of the chip C to the outer area of the chip C adjacent to the central area of the chip C. Thus, the third ejecting unit 123 ejects the gas to the remaining area excluding the central area of the chip C while moving in the spiral manner in the remaining area. Accordingly, when the spiral movement of the third ejecting unit 123 according to the spiral movement of the third orthogonal robot 133 has been completed, the pick-up target chip 1 (or the chip C) may have a concave shape.

Due to the control of the controller 240, the third ejecting unit 123 and the third orthogonal robot 133 may move and operate in the space (e.g., space 115 of FIG. 1) of the first wafer stage 111 until each of all of a plurality of chips C into which the wafer W disposed on the first wafer stage 111 has been divided has been subjected to the ejection of the gas and thus has the concave shape.

The fourth ejecting unit 124 may be positioned in a central area along the second direction D2 and the third direction D3 of the fourth orthogonal robot 134 so as to overlap with the central area of the chip C along the second direction D2 and the third direction D3.

That is, due to the movement in the second direction D2 or the third direction D3 of the fourth orthogonal robot 134 in the space (e.g., space 115 of FIG. 1) of the second wafer stage 112, the fourth ejecting unit 124 moves to a position under a position of the dicing tape 2 corresponding to the central area of the chip C, wherein the chip C has the concave shape since the chip C is previously transferred to the second wafer stage 112 from the first wafer stage 111. Then, the fourth ejecting unit 124 ejects the gas (e.g., air) only toward the central area of the chip C so that the chip C may be peeled off from the dicing tape.

De to the control of the controller 240, the fourth ejecting unit 124 and the fourth orthogonal robot 134 may move and operate in the space (e.g., space 115 of FIG. 1) of the second wafer stage 112 until the fourth ejecting unit 124 ejects the gas sequentially or irregularly onto the central areas of all of the plurality of chips C having the concave shape, due to being previously transferred from the first wafer stage 111, such that all of the chips C may be peeled off from the dicing tape 2 and picked up by the collet apparatus 10.

In this regard, the chip ejecting apparatus according to some embodiments of the present disclosure may have a configuration in which the fourth ejecting unit 124 ejects the gas to the lower surface of the dicing tape 2 in the first direction D1 while the fourth ejecting unit 124 is in a non-contact state with the dicing tape 2, or a configuration in which a fourth ejecting unit 124 may peel off the chip C from the dicing tape 2 in a different manner from the above manner.

For example, the fourth ejecting unit 124 mounted on the fourth orthogonal robot 134 may include a needle, a pin, or a block movable up and down along the first direction D1 in the space 115 of the second wafer stage 112. Thus, the needle, the pin, or the block may directly push up the central area of each of the chips C, that have the concaved shape and are transferred and seated onto the second wafer stage 112 while attached to the dicing tape 2, such that the chips C may be peeled off from the dicing tape 2 and picked up by collet apparatus 10.

In one example, the chip ejecting apparatus according some embodiments of the present disclosure may further include a transfer robot 140 provided between the first wafer stage 111 and the second wafer stage 112 and configured to transfer and place the wafer W disposed on the first wafer stage 111 onto the second wafer stage 112.

Specifically, due to the control of the controller 240, while the third ejecting unit 123 moves in the spiral manner according to the spiral movement of the third orthogonal robot 133 while being disposed in the space of the first wafer stage 111, the third ejecting unit 123 ejects the gas to the lower surface of the chip C. Then, as the third orthogonal robot 133 moves in the second direction D2 and the third direction D3, the third ejecting unit 123 moves to a position under another chip C and ejects the gas to the lower surfaces of the other chip C.

Then, the third ejecting unit 123 sequentially moves to positions under remaining chips C seated on the wafer W and sequentially ejects the gas to lower surfaces of the remaining chips C, such that each of the chips C seated on the wafer W is peeled off from the dicing tape sequentially from a corner at one side of an edge area of each chip C to an outer area adjacent to a central area of the chip C, and thus has a concave shape.

Then, the wafer W is transferred from the first wafer stage 111 to the second wafer stage 112 and seated on the second wafer stage 112 by the transfer robot 140.

Then, due to the control of the controller 240, the fourth orthogonal robot 134 moves in the second direction D2 or the third direction D3 while being positioned in the space (e.g., space 115 of FIG. 1) defined in the second wafer stage 112 such that the fourth ejecting unit 124 mounted on the fourth orthogonal robot 134 ejects the gas onto a central area, in the second direction D2 and the third direction D3, of each of the chips C, such that the chips C are sequentially peeled off and the collet apparatus 10 picks up the peeled chips C upwardly in the first direction D1.

As described above, in the chip ejecting apparatus according to some embodiments of the present disclosure, the ejecting unit 120 includes at least one ejecting unit installed in the space (e.g., space 115 of FIG. 1) of each of the first wafer stage 111 and the second wafer stage 112, and the orthogonal robot 130 includes at least one orthogonal robot installed in the space (e.g., space 115 of FIG. 1) of each of the first wafer stage 111 and the second wafer stage 112. Thus, the peeling efficiency of the chip C from the dicing tape 2 and the pickup efficiency of the chip C using the collet apparatus 10 may be improved, such that the productivity of the semiconductor chip C may be improved.

Hereinafter, referring back to FIG. 1 to FIG. 10 and referring to FIG. 19, a chip ejecting method according to some embodiments of the present disclosure is described.

Figure 19:
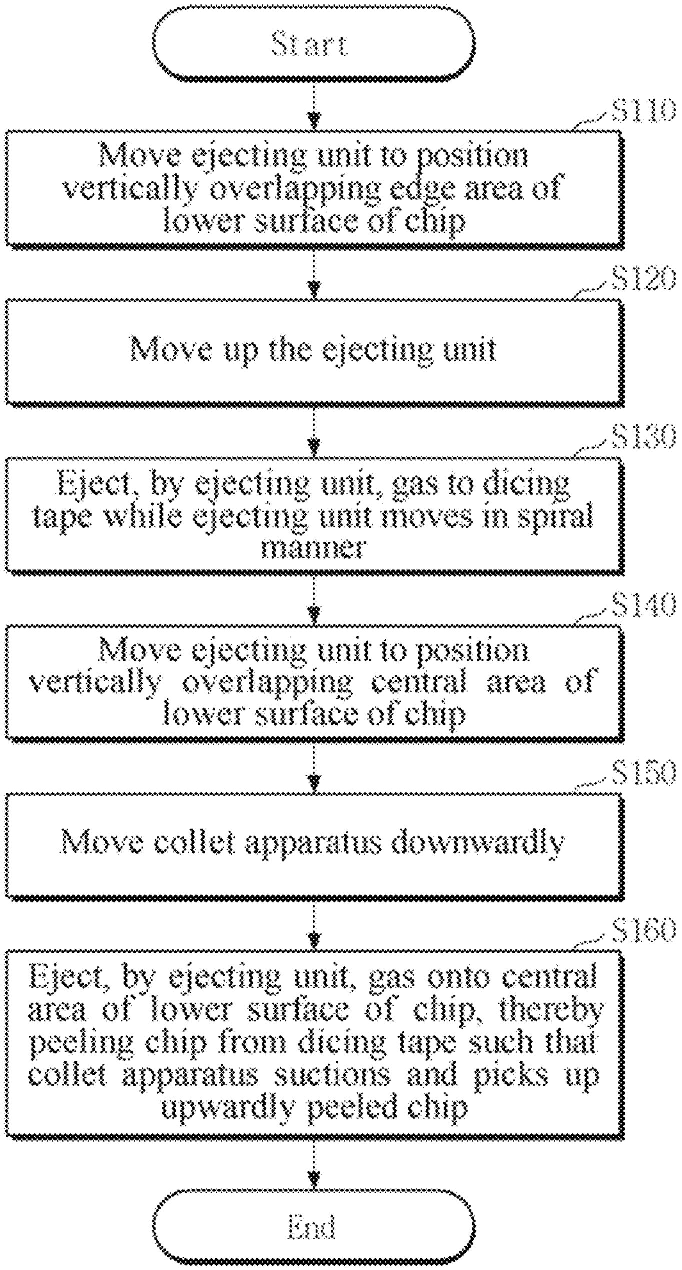
FIG. 19 is a flowchart schematically shown to illustrate a chip ejecting method using a chip ejecting apparatus according to some embodiments of the present disclosure.

FIG. 19 is a flowchart schematically shown to illustrate a chip ejecting method using a chip ejecting apparatus according to some embodiments of the present disclosure.

According to embodiments of the present disclosure, the controller 240 may be configured to perform the chip ejecting method.

Referring back to FIG. 1 to FIG. 10 and referring to FIG. 19, through a dicing process, the wafer W may be cut to form a plurality of semiconductor chips C that are spaced apart from each other. The plurality of chips C may be provided to the chip ejecting apparatus while being attached to the dicing tape 2. The chips C attached to the dicing tape 2 may be placed on the wafer stage 110.

First, while being positioned in the space 115 of the wafer stage 110, the orthogonal robot 130 moves in the second direction D2 or the third direction D3 and reaches a position under the pick-up target chip 1 in the first direction D1.

Subsequently, as the orthogonal robot 130 moves in the spiral manner, the ejecting unit 120 mounted thereon moves to a position vertically overlapping with the edge area of the lower surface of the pick-up target chip 1 (operation S110).

Subsequently, due to the controller 240 controlling operation of the driving power supply including the first motor 221, a vertical level of the ejecting unit 120 is adjusted such that the ejecting unit 120 moves up toward the lower surface in the first direction D1 of the dicing tape 2 to a vertical level at which the ejecting unit 120 does not contact the lower surface of the dicing tape 2 (operation S120).

Subsequently, while, according to the spiral movement of the orthogonal robot 130 do to the control of the controller 240, the ejecting unit 120 moves in a spiral fashion from the position vertically overlapping with the corner at one side of the edge area of the lower surface of the pick-up target chip C to a position adjacent to the central area, along the second direction D2 and the third direction D3, of the pick-up target chip C, the ejecting unit 120 ejects the gas (e.g., air) (operation S130).

In this regard, due the controller 240 controlling operations of a plurality of second motors 231 and a plurality of third motors 232 of the driving power supply, the ejecting unit 120 moves in the spiral manner due to the spiral movement of the orthogonal robot 130.

Subsequently, the ejecting unit 120 moves to a position vertically overlapping with the central area of the lower surface of the pick-up target chip 1 due to the movement in the second direction D2 or the third direction D3 of the orthogonal robot 130 (operation S140).

Next, the collet apparatus 10 oriented to face a top of the pick-up target chip 1 in the first direction D1 is lowered toward the pick-up target chip 1 along the first direction D1 (operation S150).

Subsequently, the ejecting unit 120 ejects the gas to the central area, in the second direction D2 and the third direction D3, of the lower surface of the pick-up target chip 1, thereby peeling the pick-up target chip 1 from the dicing tape 2 (operation S160). Thus, the collet apparatus 10 suctions and picks up the removed pick-up target chip 1 upwardly along the first direction D1 (operation S160).

As described above, in the chip ejecting apparatus and method according to some embodiments of the present disclosure, the chip C may be removed from the dicing tape 2 in a non-contact gas ejecting manner, thereby minimizing the stress applied to the chip C. A single ejecting apparatus may cope with various sizes or thicknesses of the chips C, thereby suppressing the inconvenience of preparing or replacing a ejecting apparatus per each size or thickness of the chip C. Further, the vertical level at which the ejecting unit ejects the gas ejected to the chip C may be controlled to cope with various sizes or thicknesses of the chips C. Thus, the productivity may be improved.

According to embodiments of the present disclosure, the controller 240 may include at least one processor and memory storing computer instructions. The computer instructions may be configured to, when executed by the at least one processor, cause the controller 240 to perform at least the functions described herein.

While non-limiting example embodiments of the present disclosure have been described with reference to the accompanying drawings, it will be understood by those skilled in the art that embodiments of the present disclosure can be implemented in other specific forms that are included in the scope of the present disclosure. Therefore, the example embodiments described above should be considered in all respects as illustrative and not restrictive.

What is claimed is:

1. A chip ejecting apparatus comprising:
- a wafer stage configured to receive a dicing tape and a plurality of chips attached to the dicing tape;
- an ejector under the wafer stage, the ejector configured to eject gas toward a lower surface of the dicing tape while being in a non-contact state with the dicing tape;
- an orthogonal robot under the wafer stage, wherein the ejector is on an upper surface of the orthogonal robot; and
- a controller configured to:
  - control the orthogonal robot and the ejector to move up and down in a first direction;
  - control the orthogonal robot to move in a second direction or a third direction;
  - control the ejector to move in a spiral manner in the second direction and the third direction by controlling the orthogonal robot to move in the spiral manner; and
  - control an ejecting pressure of the gas of the ejector.

2. The chip ejecting apparatus of claim 1, wherein the controller is further configured to vary a contact area of the gas with the lower surface of the dicing tape by adjusting a vertical dimension by which the ejector moves up and down.

3. The chip ejecting apparatus of claim 1, wherein the orthogonal robot has a rectangular cross section along the second direction and the third direction, and a chip, from among the plurality of chips, has a rectangular cross section along the second direction and the third direction.

4. The chip ejecting apparatus of claim 1, wherein the orthogonal robot has a cross-sectional area size along the second direction and the third direction corresponding to a cross-sectional area size of a chip, from among the plurality of chips, along the second direction and the third direction.

5. The chip ejecting apparatus of claim 1, wherein the controller is further configured to control the orthogonal robot to move in the spiral manner from a position vertically overlapping with a corner of a chip, from among the plurality of chips, at one side of an edge area of the chip to a central area, along the second direction and the third direction, of the chip such that the ejector on the orthogonal robot moves in the spiral manner.

6. The chip ejecting apparatus of claim 5, wherein the controller is further configured to control the ejector, while in a state in which the ejector has been raised in the first direction by the orthogonal robot, to eject the gas toward the dicing tape while moving the ejector in the spiral manner such that the chip is peeled from the dicing tape.

7. The chip ejecting apparatus of claim 1, wherein the controller is further configured to control the orthogonal robot and the ejector such that a chip, from among the plurality of chips, is peeled off from the dicing tape sequentially from a corner at one side of an edge area of the chip to a central area of the chip.

8. The chip ejecting apparatus of claim 1, wherein the controller is further configured to:
- control the orthogonal robot and the ejector such that a chip, among the plurality of chips, has a concave shape; and
- control the ejector, while the chip has the concave shape, to eject the gas onto a central area of the lower surface of the dicing tape.

9. The chip ejecting apparatus of claim 1, wherein the ejector comprises a first ejector and a second ejector,
- wherein the orthogonal robot comprises a first orthogonal robot and a second orthogonal robot,
- wherein the first ejector is on the first orthogonal robot and the second ejector is on the second orthogonal robot.

10. The chip ejecting apparatus of claim 9, wherein the controller is further configured to control the first orthogonal robot to move in the spiral manner from a position vertically overlapping with a corner of a chip from among the plurality of chips, at one side of an edge area of the chip, to an outer area of the chip adjacent to a central area, along the second direction and the third direction, of the chip such that the first ejector moves in the spiral manner.

11. The chip ejecting apparatus of claim 9, wherein the second ejector is on a central area, along the second direction and the third direction, of the second orthogonal robot so as to be configured to overlap a central area, along the second direction and the third direction, of a chip from among the plurality of chips.

12. The chip ejecting apparatus of claim 9, wherein the controller is further configured to control the first orthogonal robot and the second orthogonal robot to move in the second direction or the third direction while under the wafer stage, such as to avoid mutual interference between the first orthogonal robot and the second orthogonal robot.

13. The chip ejecting apparatus of claim 9, wherein the controller is further configured to:
- control the first orthogonal robot to move in the spiral manner such that the first ejector moves in the spiral manner;
- control the first ejector to eject the gas to a lower surface of a pick-up target chip, from among the plurality of chips, while the first ejector moves in the spiral manner;
- control the first orthogonal robot to move to a position under a next pick-up target chip, from among the plurality of chips, after the first ejector ejects the gas to the lower surface of the pick-up target chip;
- control, while or after the first orthogonal robot moves to the position under the next pick-up target chip, the second orthogonal robot to move to a position under the pick-up target chip; and
- control, while the second orthogonal robot is at the position under the pick-up target chip, the second ejector to eject the gas to a central area, in the second direction and the third direction, of the lower surface of the pick-up target chip.

14. The chip ejecting apparatus of claim 1, wherein the wafer stage comprises a first wafer stage and a second wafer stage,
- wherein the ejector comprises a first ejector under the first wafer stage and a second ejector under the second wafer stage, wherein the orthogonal robot comprises a first orthogonal robot and a second orthogonal robot, and wherein the first ejector is on the first orthogonal robot, and the second ejector is on the second orthogonal robot.

15. The chip ejecting apparatus of claim 14, wherein the controller is further configured to control the first orthogonal robot to move in the spiral manner from a position vertically overlapping with a corner of a chip from among the plurality of chips, at one side of an edge area of the chip to an outer area of the chip, adjacent to a central area along the second direction and the third direction of the chip, such that the first ejector on the orthogonal robot moves in the spiral manner.

16. The chip ejecting apparatus of claim 14, wherein the second ejector is on on a central area, along the second direction and the third direction, of the second orthogonal robot so as to be configured to overlap with a central area, along the second direction and the third direction, of a chip from among the plurality of chips.

17. The chip ejecting apparatus of claim 14, wherein the controller is further configured to control the first orthogonal robot and the second orthogonal robot to move in the second direction or the third direction, while under the first wafer stage and under the second wafer stage, respectively.

18. The chip ejecting apparatus of claim 14, further comprising a transfer robot between the first wafer stage and the second wafer stage and configured to transfer and place a wafer disposed on the first wafer stage onto the second wafer stage, wherein the controller is further configured to:

control the first orthogonal robot to move, while under the first wafer stage, in the spiral manner from a corner of a chip, from among the plurality of chips, at one side of an edge area of the chip to an outer area of the chip, adjacent to a central area of the chip, such that the first ejector moves in the spiral manner;

control, while the first ejector moves in the spiral manner, the first ejector to eject the gas to a lower surface of the chip, such that the chip is peeled off from the dicing tape sequentially from the corner of the chip to the outer area of the chip adjacent to the central area of the chip, such that the chip has a concave shape;

control, after the first ejector ejects the gas to the lower surface of the chip, the first orthogonal robot to move in the second direction or the third direction such that the first ejector moves to a position under another chip among the plurality of chips;

control the first orthogonal robot to move, while under the other chip, in the spiral manner from a corner of the other chip at one side of an edge area of the other chip to an outer area of the other chip, adjacent to a central area of the other chip, such that the first ejector moves in the spiral manner;

control, while the first ejector moves in the spiral manner under the other chip, the first ejector to eject the gas to a lower surface of the other chip, such that the other chip is peeled from the dicing tape sequentially from the corner of the other chip to the outer area of the other chip adjacent to the central area of the other chip, such that the other chip has the concave shape;

control, after the transfer robot transfers the wafer from the first wafer stage to the second wafer stage, the second orthogonal robot to move, while under the second wafer stage, in the second direction or the third direction such that the second ejector is under the central area of the chip;

control, while the second ejector is under the central area of the chip, the second ejector to eject the gas to the central area of the chip, such that the chip is peeled from the dicing tape;

control, after the second ejector ejects the gas to the central area of the chip, the second orthogonal robot to move, while under the second wafer stage, in the second direction or the third direction such that the second ejector is under the central area of the other chip; and control, while the second ejector is under the central area of the other chip, the second ejector to eject the gas to the central area of the other chip, such that the other chip is peeled from the dicing tape.

19. A chip ejecting apparatus comprising:

a wafer stage configured to receive a dicing tape and a plurality of chips attached to the dicing tape;

an ejector under the wafer stage, the ejector configured to eject gas toward a lower surface of the dicing tape while being in a non-contact state with the dicing tape;

an orthogonal robot under the wafer stage, wherein the ejector is on an upper surface of the orthogonal robot; and a controller configured to:

control the orthogonal robot and the ejector to move up and down in a first direction;

control the orthogonal robot to move in a second direction or a third direction;

control the ejector to move in a spiral manner in the second direction and the third direction by controlling the orthogonal robot to move in the spiral manner; and control an ejecting pressure of the gas of the ejector, wherein the controller is further configured to:

vary a contact area of the gas with a lower surface of the dicing tape by adjusting a vertical dimension by which the ejector moves up and down;

control the orthogonal robot to move in the spiral manner from a position vertically overlapping with a corner of a chip, from among the plurality of chips, at one side of an edge area of the chip to a central area, along the second direction and the third direction, of the chip such that the ejector on the orthogonal robot moves in the spiral manner;

control the ejector, while in a state in which the ejector has been raised in the first direction by the orthogonal robot, to eject the gas toward the dicing tape while moving the ejector in the spiral manner such that the chip is peeled from the dicing tape sequentially from the corner of the chip to the central area of the chip, and wherein the chip has a concave shape just before the gas is ejected from the ejector towards the central area of the chip.

20. A chip ejecting method performed by a controller of a chip ejecting apparatus, the chip ejecting method comprising:

moving an orthogonal robot of the chip ejecting apparatus to a position vertically overlapping with, in a first direction, an edge area of a lower surface of a chip such that an ejector on the orthogonal robot moves to the position, wherein the chip is on a dicing tape;

adjusting a vertical level of the ejector to vary a contact area of gas with a lower surface of the dicing tape;

moving the orthogonal robot in a spiral manner from a position vertically overlapping with a corner of the chip to a position adjacent to a central area, along a second direction and a third direction, of the chip such that the ejector moves in the spiral manner;

ejecting, by the ejector, the gas to the dicing tape while the ejector moves in the spiral manner;

moving, after the ejector moves in the spiral manner, the orthogonal robot to a position vertically overlapping with the central area of the chip such that the ejector moves to the position vertically overlapping with the central area;

moving a collet apparatus downwardly in the first direction; and ejecting, by the ejector, the gas to the central area of the chip, thereby peeling the chip from the dicing tape such that the collet apparatus is able to suction and pick up the chip in the first direction.

* * * * *